United States Patent [19]

Levine

[11] 4,158,209
[45] Jun. 12, 1979

[54] CCD COMB FILTERS

[75] Inventor: Peter A. Levine, Trenton, N.J.

[73] Assignee: RCA Corporation, New York, N.Y.

[21] Appl. No.: 920,389

[22] Filed: Jun. 29, 1978

Related U.S. Application Data

[62] Division of Ser. No. 821,100, Aug. 2, 1977.

[51] Int. Cl.² .................. H04N 9/535; H01L 29/78
[52] U.S. Cl. ........................................ 358/31; 357/24
[58] Field of Search ............... 358/31, 37; 307/221 D; 357/24; 328/166

[56] References Cited

U.S. PATENT DOCUMENTS

| | | | |
|---|---|---|---|
| 3,660,697 | 5/1972 | Berglund et al. | 307/304 |
| 3,858,232 | 12/1974 | Boyle et al. | 357/24 |
| 4,041,298 | 8/1977 | Lampe et al. | 357/24 |
| 4,096,516 | 6/1978 | Pritchard | 358/31 |

OTHER PUBLICATIONS

Koscnockey et al., "Basic Concepts of Charge-Coupled Devices," *RCA Review*, vol. 36, Sep. 1975, pp. 566–593.
Sequin et al., "Linearity of Electrical Charge Injection Into Charge-Coupled Devices," IEEE Journal of Solid-State Circuits, vol. SC-10, No. 2, Apr. 1975, pp. 81–92.

*Primary Examiner*—John C. Martin
*Attorney, Agent, or Firm*—H. Christoffersen; Samuel Cohen

[57] ABSTRACT

Comb filter which includes a first CCD delay line for imparting a delay equal to one horizontal line time plus the delay inserted by N additional stages and second and third CCD delay lines, each having N stages. Video signal is applied to the first and second delay lines and its complement to the third delay line. The gains of the second and third CCD delay lines are controlled to make them equal to that of the first CCD delay line to control the depth of the rejection notches of the filter to desired levels. In one embodiment, feedback from the output of the first and second lines is employed to control the gain of the second line and feedback from the output of the first and third lines is employed to control the gain of the third line. In another embodiment, the respective gains are controlled in open loop fashion by controlling the residual charge in the input storage well of CCD's operated in the skimming mode.

10 Claims, 8 Drawing Figures

CCD COMB FILTERS

This application is a division of application Ser. No. 821,100 filed Aug. 2, 1977.

The present invention relates to gain control circuits for charge coupled devices (CCD's) and particularly to comb filters including such circuits.

Copending U.S application Ser. No. 758,184 for "Linear CCD Input Circuit," filed Jan. 10, 1977 by J. E. Carnes, P. A. Levine (the present inventor), and D. J. Sauer and assigned to the same assignee as the present application, discusses a particular kind of input circuit for a buried channel CCD. This circuit colloquially is now referred to as a "fan and skim" input circuit. It is especially useful in CCD delay lines employed to delay analog signals such as the video signals of television as it permits linear signal translation.

Figure 1:
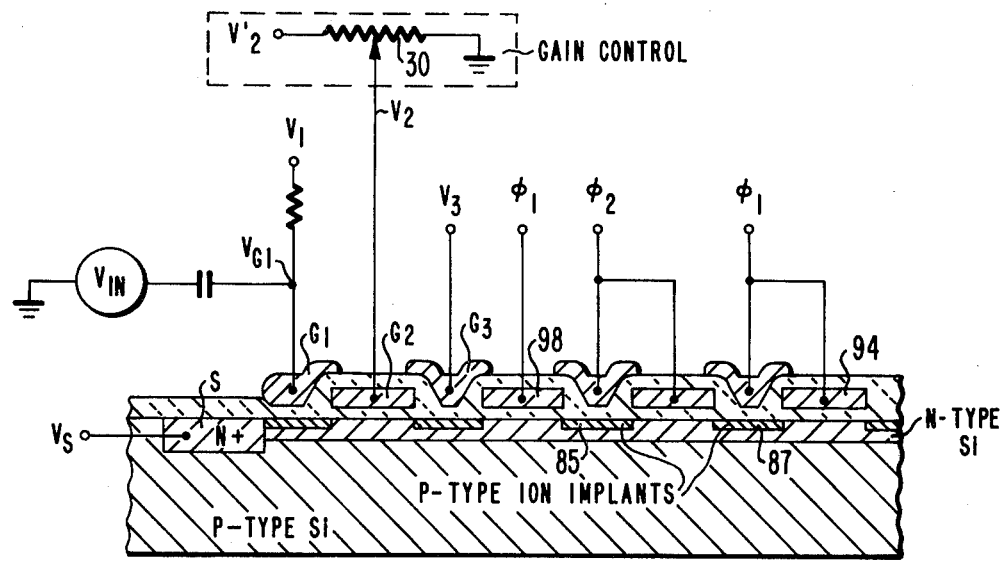
FIG. 1 is a section through a CCD embodying the invention.
Figure 2:
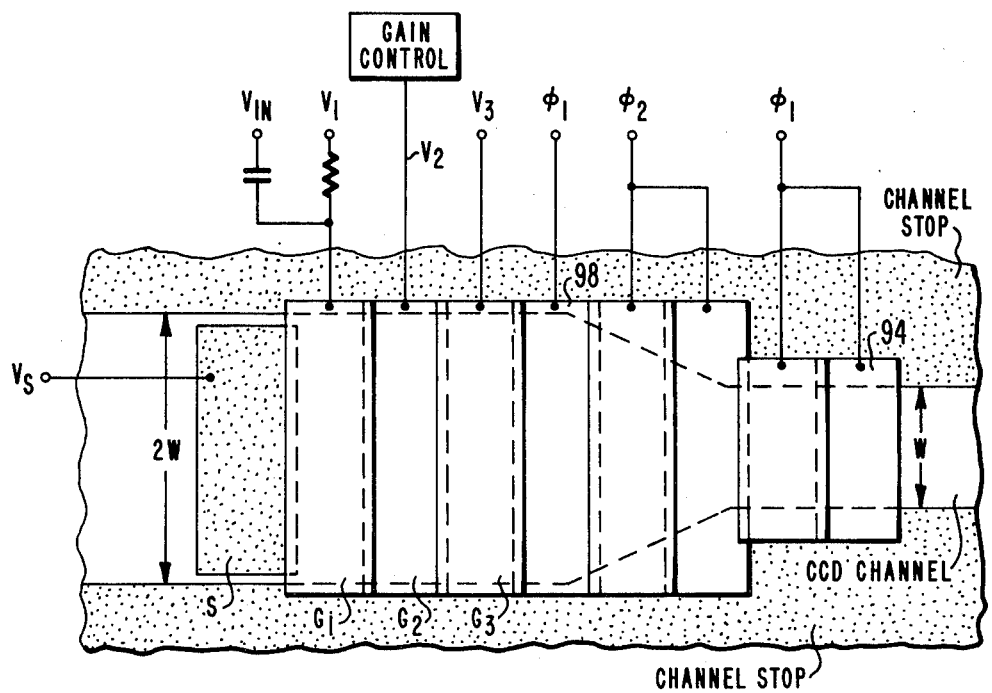
FIG. 2 is a plan view of the CCD of FIG. 1.

The CCD signal register shown in section in FIG. 1 and in plan view in FIG. 2, except for the gain control circuit, is similar to the CCD register described in the above-identified application. However, the present system, by way of example, utilizes self-aligned barrier implants such as 85 and 87 under the second layer of gate electrodes (rather than DC offsets between electrode pairs) to obtain asymmetrical potential wells in the substrate for permitting unidirectional charge propagation with two phase clocking. Typical processing parameters for a buried N-channel CCD with with the structure are: (1) Substrate: P-type 30–50 Ω-cm resistivity; (2) N-type buried layers implant: Phosphorous, Dose = $1.3 \times 10^{12}/cm^2$, Energy = 150 keV, junction depth $X_j = 0.75$ micron; (3) P-type barrier implant: Boron, Dose = $4 \times 10^{11}/cm^2$, Energy = 100 keV.

As in the register of the copending application, the present CCD includes electrodes $G_1$, $G_2$ and $G_3$ and these are followed by multiple phase electrodes. The electrodes $G_1$, $G_2$ and $G_3$ are operated in such a way that a residual charge level $Q_F$ (FIG. 4) always remains stored in the potential well beneath electrode $G_2$. This residual charge level places the operating point of the circuit at a desired point in the linear region of the input transfer characteristic of the CCD. Superimposed over this residual charge level $Q_F$ is an additional charge which may comprise a bias plus signal charge $Q_{(B+S)}$. This additional charge subsequently is "skimmed" from the potential well beneath electrode $G_2$ and transmitted down the CCD register. The CCD channel is relatively wide in the region of electrodes $G_1$, $G_2$ and $G_3$ and tapers down in width by an amount such that the maximum bias plus signal charge $Q_{(B+S)}$ will fill the first potential well in the narrowest channel region. In the example illustrated, the channel tapers from width 2 W to width W.

Figure 3:
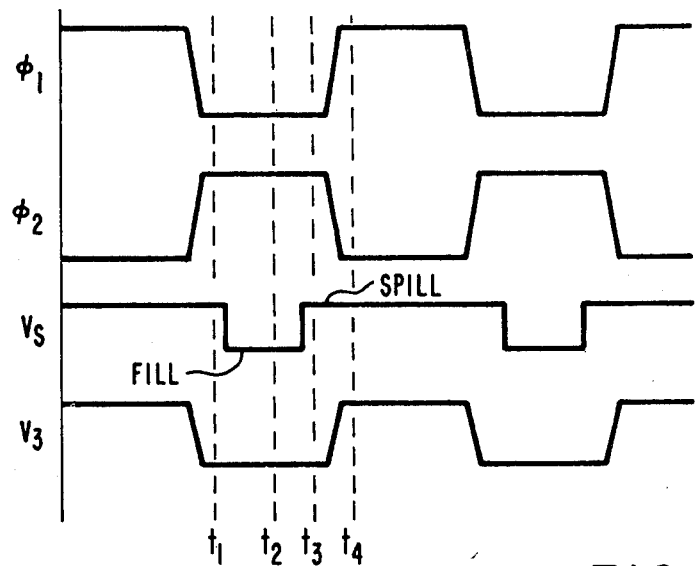
FIG. 3 is a drawing of waveforms employed for operating the CCD of FIGS. 1 and 2.
Figure 4:
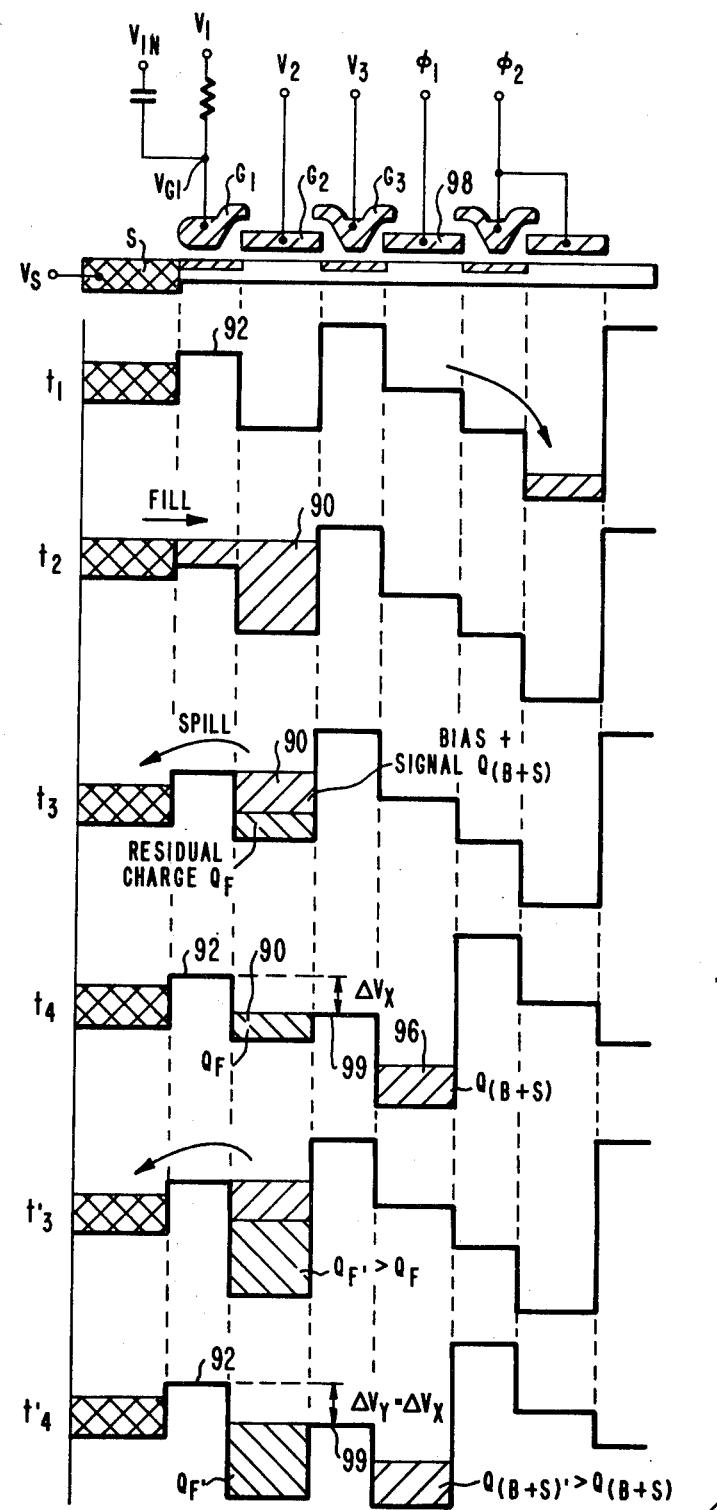
FIG. 4 is a drawing of substrate potential profiles to help explain the operation of the CCD of FIGS. 1 and 2.

The operation above is depicted in the substrate potential profiles of FIG. 4 when considered in connection with the operating waveforms of FIG. 3. At time $t_2$, the voltage $V_S$ applied to diffusion S causes this diffusion to operate as a source of charge carriers (electrons) and these flow into the potential well 90 beneath electrode $G_2$. At time $t_3$, the voltage $V_S$ is at a more positive level sufficiently so to cause the diffusion S to operate as a drain, and excess charge spills from the potential well 90 back into the diffusion S. There remains in potential well 90 a residual charge level $Q_F$ and a bias plus signal charge $Q_{(B+S)}$. This bias plus signal charge includes a direct voltage component whose value is dependent on the voltage $V_1$ applied to gate electrode $G_1$. That is, this bias component is dependent on the level of potential barrier 92 in the absence of input signal. In the case of a symmetrical input signal $V_{IN}$, the voltage $V_1$ will establish a potential barrier 92 such that the bias component of the charge $Q_{(B+S)}$ will be at the center of the linear region of the input characteristic. This may correspond, for example, to ½ the capacity of the potential well beneath electrode 94 in the main portion of the CCD channel, that is, the narrowed down portion of the CCD channel as shown in FIG. 2. For an asymmetrical input signal, the voltage $V_1$ can be made to cause an operating point close to either end of the linear region of the input characteristic of the CCD, depending upon the direction of asymmetry of the input signal. In one limiting case, $V_1$ may be at a level such that $Q_B$ is zero. In another it may be at a level such that the input potential well is full in the absence of a signal $V_{IN}$.

At time $t_4$, when the voltage $V_3$ applied to the gate electrode $G_3$ is at its most positive value and when $\phi_1$ is also at its most positive value, the charge $Q_{(B+S)}$ has transferred from well 90 to the potential well 96 now present beneath the first phase 1 ($\phi_1$) electrode 98. In other words, this charge $Q_{(B+S)}$ has been skimmed from the potential well 90, leaving behind the residual charge level $Q_F$. The charge $Q_{(B+S)}$ subsequently is propagated down the CCD in conventional fashion.

In the operation of the system of the copending application identified above, the voltage $V_2$ applied to gate electrode $G_2$ is held at a fixed level so that the residual charge $Q_F$ also remains at a fixed level. The amount of charge propagated from potential well 90 (FIG. 4) to potential well 96, is a function of the difference in substrate potentials $\Delta V_X$ between substrate potentials at 92 and 99. These, in turn, are a function of the difference in potential $V_{G1} - V_3$ applied to gate electrodes $G_1$ and $G_3$, respectively, where $V_{G1}$ includes both the DC and AC components applied to gate electrode $G_1$.

The present invention resides, in part, in the discovery that the gain of the input circuit to the CCD is a function of the voltage $V_2$ applied to gate electrode $G_2$, that is, it is a function of the residual charge level $Q_F$. The present inventor has found that for a given $\Delta V_X$, if $V_2$ is made more positive, that is, if the size of the residual charge packet $Q_F$ is increased, the gain of the input circuit is increased and vice-versa. This is illustrated in FIG. 4 by the last three substrate potential profiles. At time $t_4$, the voltage $V_2$ is at a level such that a residual charge level $Q_F$ remains in potential well 90 for a given difference in potential $\Delta V_X$ between surface potentials 92 and 99. The transferred charge is $Q_{(B+S)}$ which subsequently is propagated down the CCD. If $V_2$ is increased while the difference between surface potentials 92 and 99 remains the same, the amount of transferred charge $Q_{(B+S)}'$ increases. This is illustrated by the potential profiles at time $t_3'$ and $t_4'$. In the former, which illustrates the spill portion of the cycle corresponding to $t_3$, $V_2$ has been made more positive so that the residual charge component $Q_F'$ has been increased, that is, $Q_F' > Q_F$. At time $t_4'$ corresponding to time $t_4$, the difference $\Delta V_X$ between substrate potentials 92 and 99 is equal to $V_Y$; however, the amount of charge transferred $Q_{(B+S)}'$ is greater than $Q_{(B+S)}$.

Figure 5:
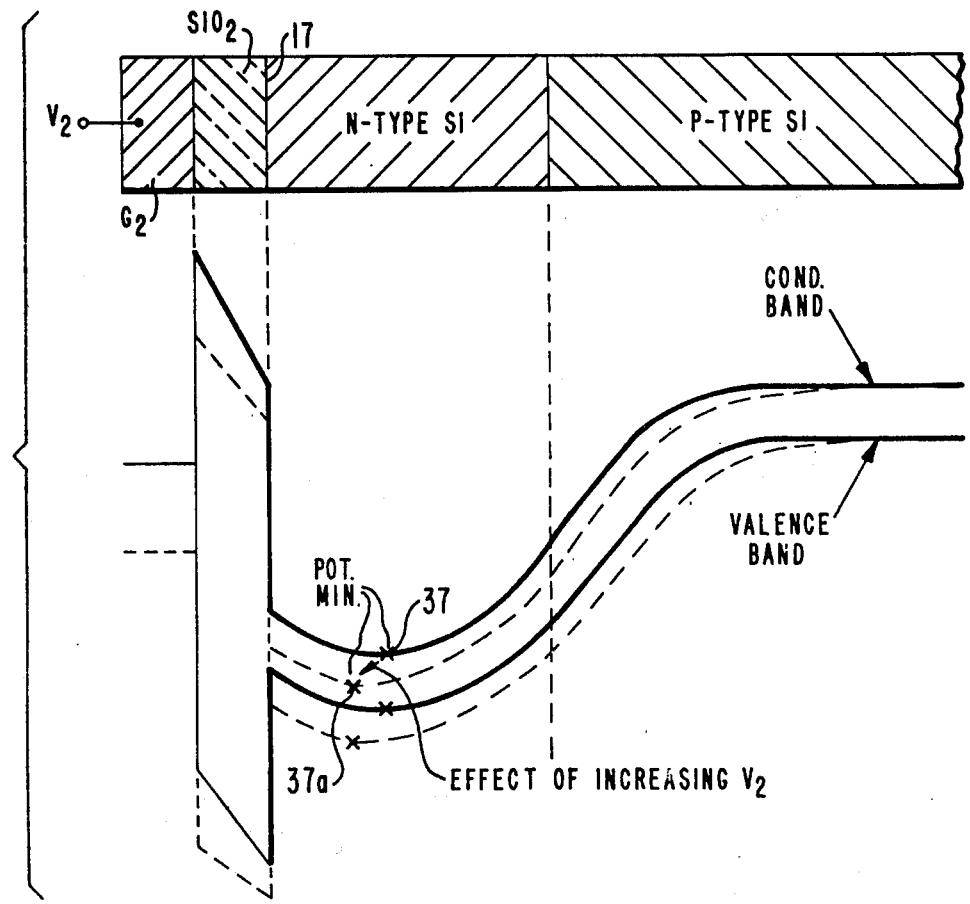
FIG. 5 is a drawing of electron energy bands of a CCD embodying the invention.

The reason for the above is not completely understood. However, the following model may provide a basis for an explanation. It is believed that as the voltage $V_2$ applied to the gate electrode $G_2$ is increased, the depth of the potential minimum of the conduction band increases and the potential valley in the conduction band moves toward the surface 17 of the N-type silicon layer as illustrated in the energy band diagram of FIG. 5. The solid line illustrates the substrate potentials for a lower value of $V_2$ and the dashed line the shift which occurs when the voltage $V_2$ is increased in a sense to increase the residual charge level $Q_F$. Note the shift in the potential minimum from 37 to 37a, 37a being closer to surface 17. This change in the position of the potential minimum is believed to be manifested as an effective increase in the capacitance C of the CCD channel, and as the charge signal amplitude $Q_{SIG}$ is a function of this capacitance C, this increases $Q_{SIG}$. The expression these quantities is:

$$Q_{SIG} \alpha \Delta (V_3 - V_{G1}) C$$

Figure 6:
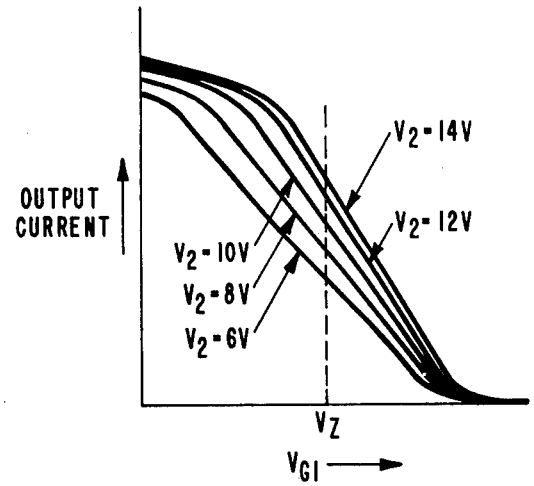
FIG. 6 is a family of graphs to help explain the operation of the CCD of FIGS. 1 and 2.

The family of curves of FIG. 6 illustrates the operation of the present gain control circuit. Each curve was obtained by applying a linear ramp $V_{G1}$ to a gate electrode corresponding to $G_1$ while maintaining fixed the voltage $V_3$ applied to a gate electrode corresponding to $G_3$. Each curve is for a different voltage level $V_2$ applied to an electrode corresponding to $G_2$. The ordinate of the curves is output current. It was measured by sensing the current produced in the output circuit ( a drain diffusion, not shown) of the CCD in response to the applied voltages. Note that at any particular value of voltage $V_{G1}$, such as $V_Z$, the input gain (slope) obtained is higher at higher values of $V_2$ than at lower values of $V_2$ (except, of course, where the curves converge at the zero output current crossing of the $V_{G1}$ axis).

Figure 7:
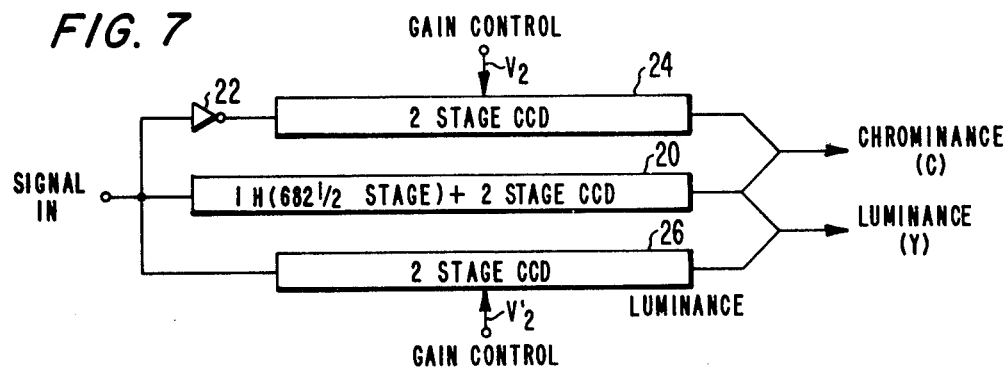
FIG. 7 is a schematic showing of a system embodying the invention.

FIG. 7 illustrates an important use of the gain control circuit of the present application. This figure shows schematically, a comb filter which may be employed for commercial television. Details of this filter are given in copending application Ser. No. 781,303 for "Electronic Signal Processing Apparatus" filed Mar. 25, 1977 by Dalton H. Pritchard issued June 20, 1978, as U.S. Pat. No. 4,096,516 and assigned to the same assignee as the present application. In brief, it includes a 1H (1 horizontal line period) plug N CCD stage delay line 20 in one branch, an inverter 22 and a N-stage CCD delay line 24 in a second branch and a N-stage CCD delay line 26 in a third branch. For a clock frequency of approximately 10.7 megahertz (MHz) (which is equal to three times the color sub-carrier frequency of 3.58 MHz) applied to the three lines 20, 24 and 26, a 1H delay is obtained with $682\frac{1}{2}$ stages, as indicated in the above-identified patent. In this particular example, N is assumed to be 2. Each 2-stage delay line has an input circuit such as shown in FIG. 1. The video signal is capacitively coupled to gate electrode $G_1$ of lines 20 and 26 and the inverted video signal is capacitively coupled to gate electrode $G_1$ of line 24. One gain control voltage ($V_2$) is applied to gate $G_2$ of line 24 and another gain control voltage (call it $V_2'$) is applied to gate $G_2$ of line 26. The long delay line 20 also has an input circuit such as shown in FIG. 1; however, the voltage $V_2$ supplied to its gate electrode need not be made controllable but can be left at a fixed level. The output signal of the long delay line 20 is combined with that of the short (two-stage) delay line 26 to produce the luminance signal, and the output signal of the long delay line 20 is combined with the output signal of the short (two-stage) delay line 24 to produce the chrominance signal. It is necessary to adjust the relative gains of the short delay lines 24 and 26 to obtain rejection notches of sufficient depth at the color subcarrier frequency, 3.58 MHz (megahertz). The gain control circuit of the present application employed in each short delay line 24 and 26 provides sufficient range to make this adjustment.

The present gain control is a significant improvement over a previous approach known to the present inventor for controlling the respective gains of the chrominance and luminance channels which required considerable on-chip transistor circuitry to balance the signals in these channels. With the present circuit it has been found possible to achieve gain variation of about ±20%, for a voltage range of 6–14 volts applied to electrode $G_2$. The means for producing a voltage in this range may simply be a potentiometer such as illustrated at 30 in FIG. 1 or may be a feedback circuit for automatically controlling the gain of electrode $G_2$. This gain variation is more than adequate for the balance control just described for the comb filter of FIG. 7.

Figure 8:
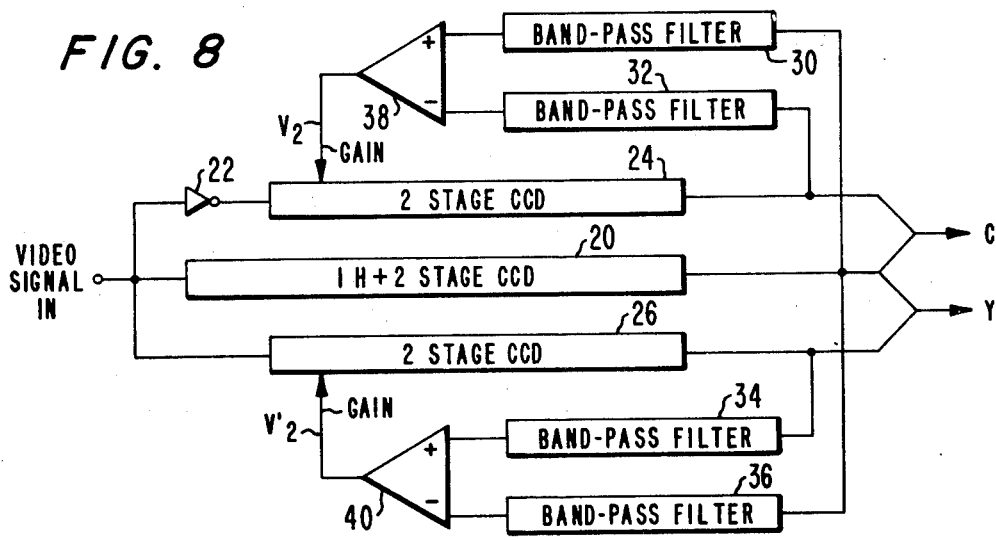
FIG. 8 is a schematic showing of a system including a feedback controlled embodiment of the invention.

FIG. 8 illustrates a comb filter such as shown in FIG. 7 but with automatic control of the gains of the short delay lines 24 and 26 by negative feedback circuits. The long and short delay lines have the same structure as described in connection with FIG. 7. The circuit includes, in addition, four band pass filters 30, 32, 34 and 36 and two differential amplifiers 38 and 40. The band pass filters are all tuned to the same particular frequency at or close to the center frequency 3.58 MHz of the color subcarrier components of the signals being passes through these lines.

In operation, the output signal of short delay line 24 is supplied through filter 32 to the inverting terminal of differential amplifier 38 and the output of the long delay line 20 is supplied through band pass filter 30 to the non-inverting terminal of the differential amplifier 38. In complementary fashion, the output of short delay 38. In complementary fashion, the output of short delay line 26 is supplied through band pass filter 34 to the non-inverting terminal of differential amplifier 40 and the output of the long delay line 20 is applied through filter 36 to the inverting terminal of differential amplifier 40. The differential amplifiers compare the signals they receive and adjust the gain of the short delay lines to control the output signal amplitude of these delay lines at the particular frequency to which the band pass filters are tuned which as already mentioned, is at or close to the color subcarrier frequency of 3.58 MHz. The control is in a sense to make the gain of the short delay lines equal to that of the long delay lines at this frequency. The result of operating in this way is to automatically control the depth of the rejection notches produced by the comb filter to their minimum levels.

While the present invention has been illustrated as embodied in a two-phase CCD, it is to be understood that it is equally applicable to CCD's operated by any practical number of phases. Further, while two layer electrodes are shown, the invention is applicable also to single layer, triple layer and other well-known CCD structures. With respect to two-phase structure, means other than the ion implants illustrated may be employed for providing asymmetrical potential wells. Further, while in the illustrated system the substrate is of P-type and the surface layer of N-type, the reverse may be the case with corresponding change in operating voltage polarity. Finally, it is to be understood that the present invention is also applicable to other (than "fill and spill") forms of buried channel CCD's which employ a residual charge which continually is present in an input potential well.

What is claimed is:

1. A comb filter comprising, in combination:
   a first charge-coupled device (CCD) delay line for imparting a delay equal to substantially one horizontal line time of a television receiver plus the delay inserted by N additional CCD stages, where N is a relatively small integer;
   second and third CCD delay lines, each having N CCD stages, said three delay lines being operated at the same clock frequency;
   means for applying a video signal to the first and second of said delay lines;
   means for applying the complement of said video signal to the third of said delay lines;
   means for combining the outputs of the first and second of said delay lines to obtain a luminance signal;
   means for combining the outputs of the first and third of said delay lines to obtain a chrominance signal;
   first feedback circuit means responsive to the outputs of said first and said second delay lines for controlling the gain of said second delay line in a sense to make it substantially equal to that of said first delay line at a particular frequency of interest; and
   second feedback circuit means responsive to the outputs of said first and said third delay lines for controlling the gain of said third delay line in a sense to make it substantially equal to that of the first delay line at said particular frequency of interest.

2. A comb filter as set forth in claim 1 wherein each feedback circuit means comprises a two-input differential amplifier.

3. A comb filter as set forth in claim 2 wherein each feedback circuit means further includes two band-pass filters tuned to said particular frequency, one band-pass filter supplying the output of one delay line to one input to the differential amplifier and the other band-pass filter supplying the output of another delay line to the second input of said differential amplifier.

4. A comb filter as set forth in claim 3 wherein all of said band-pass filters are tuned to approximately 3.58 MHz.

5. A comb filter as set forth in claim 1 wherein each of said second and third delay lines includes a substrate of one conductivity type, a surface layer of different conductivity type, a source of charge carriers in the substrate, a charge storage region in the substrate whose potential is controlled by an overlying electrode, receptive of a charge from said source of charge carriers, and means for transferring from said storage region to a transfer site in said substrate an amount of charge signal which is dependent on the amplitude of an input signal and for leaving behind in said storage region a residual charge at a given level independent of the input signal amplitude, and wherein said first feedback means connects to said electrode of said second delay line, and said second feedback means connects to said electrode of said third delay line.

6. A comb filter as set forth in claim 1 wherein $N=2$.

7. A comb filter comprising, in combination:
   a first charge-coupled device (CCD) delay line for imparting a delay equal to substantially one horizontal line time of a television receiver plus the delay inserted by N additional CCD stages, where N is a relatively small integer;
   second and third CCD delay lines, each having N CCD stages, said three delay lines being operated at the same clock frequency;
   means for applying a video signal to the first and second of said CCD delay lines;
   means for applying the complement of said video signal to the third of said CCD delay lines;
   means for combining the outputs of the first and second of said CCD delay lines to obtain a luminance signal;
   means for combining the outputs of the first and third of said CCD delay lines to obtain a chrominance signal;
   each of said second and third CCD delay lines including a substrate of one conductivity type, a surface layer of different conductivity type, a source of charge carriers in the substrate, a charge storage region in the substrate whose potential is controlled by an overlying electrode, receptive of a charge from said source of charge carriers, and means for transferring from said storage region to a transfer site in said substrate an amount $Q_S$ of charge signal which is dependent of the amplitude $V_{IN}$ of an input signal and for leaving behind in said storage region a residual charge $Q_F$ at a given level independent of the input signal amplitude; and
   means for individually controlling the transfer function $\Delta Q_S/\Delta V_{IN}$ of said second and third CCD delay lines, comprising means for applying a controllable voltage to said overlying electrode of said second CCD delay line for controlling the magnitude of said residual charge $Q_F$ in said second CCD delay line, and means for applying a controllable voltage to said overlying electrode of said third CCD delay line for controlling the magnitude of the residual charge $Q_F$ in said third CCD delay line.

8. A comb filter as set forth in claim 7 wherein said three CCD delay lines comprise buried channel CCD's.

9. A comb filter as set forth in claim 7 wherein said means for controlling the transfer function comprises first feedback circuit means responsive to the outputs of said first and second CCD delay lines for supplying a voltage to said overlying electrode of said second CCD delay line and second feedback circuit means responsive to the outputs of said first and third CCD delay lines for supplying a voltage to said overlying electrode of said third CCD delay line.

10. A comb filter as set forth in claim 7 wherein said means for controlling the transfer function comprises open loop control means for supplying the controllable voltages to said overlying electrodes, respectively, of said second and third CCD delay lines.

* * * * *